(12) United States Patent
Parry et al.

(10) Patent No.: US 11,011,215 B1
(45) Date of Patent: May 18, 2021

(54) APPARATUS WITH AN INTERNAL-OPERATION MANAGEMENT MECHANISM

(71) Applicant: Micron Technology, Inc., Boise, ID (US)

(72) Inventors: Jonathan S. Parry, Boise, ID (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/721,373

(22) Filed: Dec. 19, 2019

(51) Int. Cl.
*G06F 13/16* (2006.01)
*G11C 11/406* (2006.01)

(52) U.S. Cl.
CPC ........ *G11C 11/406* (2013.01); *G06F 13/1668* (2013.01)

(58) Field of Classification Search
CPC .................... G11C 11/406; G06F 13/1668
See application file for complete search history.

(56) References Cited

U.S. PATENT DOCUMENTS 7,996,642 B1 * 8/2011 Smith ................. G06F 12/0246
711/167

* cited by examiner

*Primary Examiner* — Jay W. Radke
(74) *Attorney, Agent, or Firm* — Perkins Coie LLP

(57) ABSTRACT

Methods, apparatuses, and systems related to scheduling internal operations are described. An apparatus detects a condition associated with repeated accesses to a memory address and/or region. In response to detection of the condition, the apparatus generates a scheduling output that secures a scheduled duration of inactivity for commanded operations. The apparatus initiates execution of one or more internal operations during the scheduled duration.

21 Claims, 6 Drawing Sheets

APPARATUS WITH AN INTERNAL-OPERATION MANAGEMENT MECHANISM

TECHNICAL FIELD

The disclosed embodiments relate to devices, and, in particular, to semiconductor memory devices with an internal-operation management mechanism.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

Figure 2:
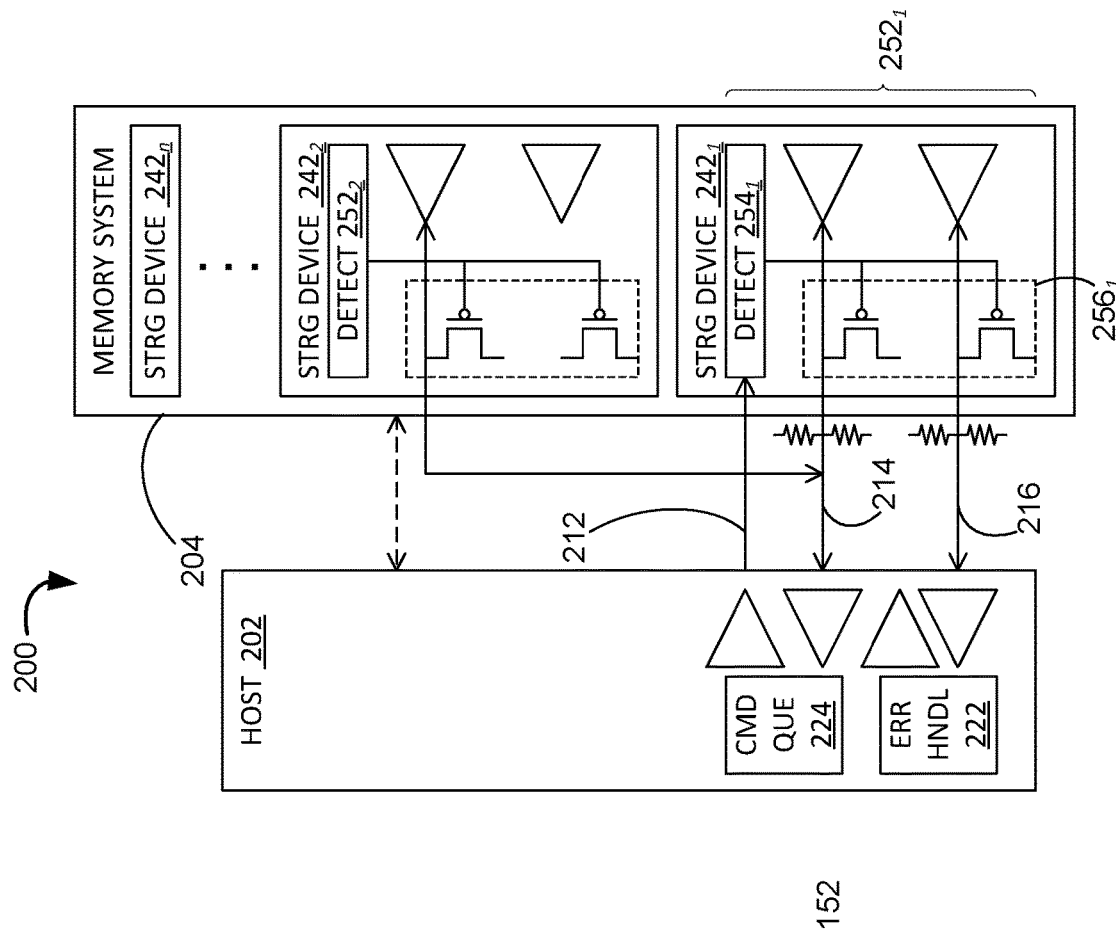
FIG. 2 is a block diagram of a computing system in accordance with an embodiment of the present technology.

As described in greater detail below, the technology disclosed herein relates to an apparatus, such as memory systems, systems with memory devices, related methods, etc., for managing memory-internal operations, such as refresh operations (e.g., row hammer refresh (RHR) operations). As described detail below, an apparatus (e.g., a memory system/device, such as a DRAM module) can detect triggering conditions, such as repeated access/activation of a memory or a region/grouping of memory cells. Upon detecting the triggering condition, the apparatus can generate a scheduling output configured to establish a time period for executing the memory-internal operations.

As memory devices become smaller and faster, storage circuits can experience data degradation due to the adverse effects of repeated access, such as for repeated reads from and/or repeated writes to the same address or addresses within a region. As an illustrated example, for "row hammer" type of memory degradation, stored charge can be lost in the cells of a word line when an adjacent or nearby word line is repeatedly activated/deactivated over a short period of time. The potential for adverse row hammer effects is further worsened for physically smaller memory devices, in which the distance between adjacent word lines decreases. To offset the potential for charge loss, the memory devices can perform RHRs to refresh (e.g., compensate for the loss by recharging) the word lines that are adjacent to a hammered word line.

Conventional devices have implemented the RHRs between or in parallel with commanded operations, such as by "stealing" one or more operating cycles. However, the time window for performing the RHRs are further decreasing as the memory devices and/or the hosts become faster. For example, DRAM devices are synchronous and perform commanded operations in real-time. In other words, the DRAM devices must write, read, and refresh data at the host's command. As such, as the overall operating speeds increase, the time used to perform the RHRs are decreasing at the same rate. Further, occurrences of pathological patterns or usage (e.g., row hammer or other repetitive access to same address or region) that require/trigger the memory-internal operations are increasing in frequency with the growth of technology. Thus, the memory-internal operations need to be executed more frequently, thereby increasing the number of failures and/or increasing the errors/issues associated with back-to-back internal operations.

As described in detail below, embodiments of the present technology can manage the time-window for performing the memory-internal operations. In some embodiments, the apparatus can detect one or more predetermined triggering conditions and generate the scheduling output by forcing error conditions, such as by reporting to or causing errors for a host independent of an occurrence of an associated error condition. For example, the apparatus can cause a system failure or report an associated error for a parity failure (e.g., a column address (CA) parity communication failure, a command parity failure, a cyclic redundancy check (CRC) failure, etc.), a data write error, a data read error, and/or a temperature failure. Also, the apparatus can alter data, such as by flipping one or more DQs, to cause a system failure. Based on the scheduling output, the host can enter into an error recovery mode during a recovery time (e.g., a predetermined duration) and resend one or more commands, data, and/or addresses. The apparatus can schedule and execute the memory-internal operations during the recovery time. Accordingly, the apparatus can secure a set duration to execute the memory-internal operations, thereby decreasing/eliminating errors caused by insufficient execution times and/or back-to-back implementations of the memory-internal operations.

Figure 1:
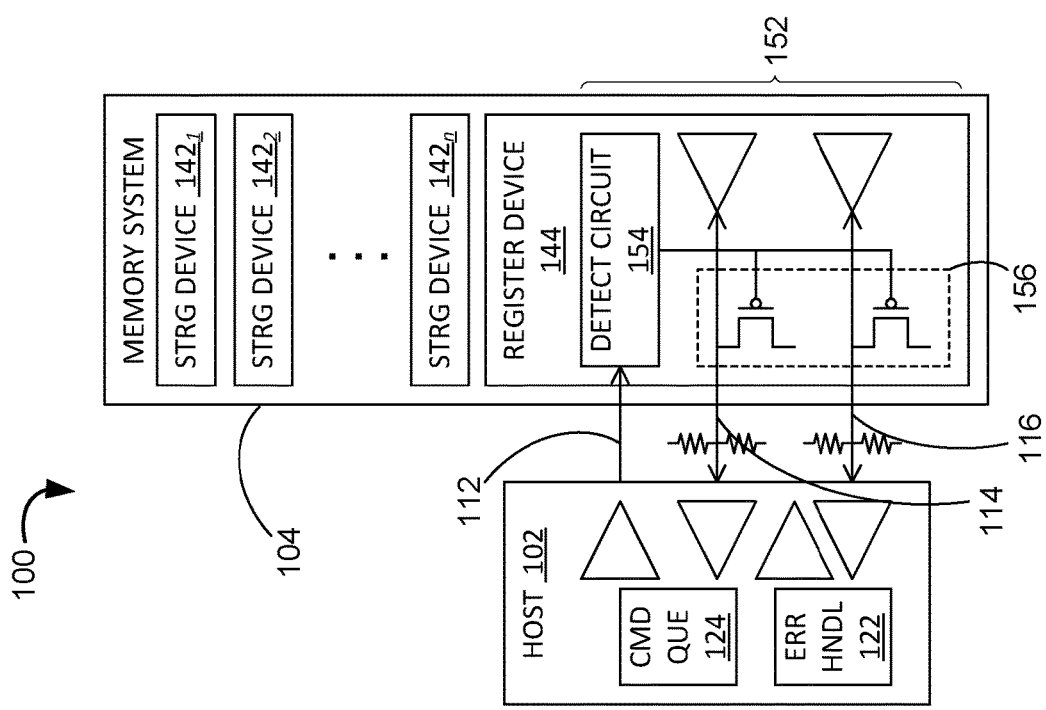
FIG. 1 is a block diagram of a computing system in accordance with an embodiment of the present technology.

FIG. 1 is a block diagram of a computing system 100 in accordance with an embodiment of the present technology. The computing system 100 can include a host 102, such as a processor, a central processing unit (CPU), a graphics processing unit (GPU), and/or other computing device, coupled to a memory system 104. The memory system 104 can include a set of devices that are together configured to store and provide access to electronic data. For example, the memory system 104 can include non-volatile memory modules, volatile memory modules, combinational systems, and/or other memory cards/systems.

In some embodiments, the host 102 and the memory system 104 can be communicatively coupled via a command-address connection 112 (e.g., a command and address bus), an alert connection 114 (e.g., an Alert line for ALERT #signal for DDR4/5 protocol), and/or a data connection 116 (e.g., a data (DQ) bus). The host 102 and the memory system 104 can communicate commands, such as for writes, reads, and/or refreshes, and associated addresses over the command-address connection 112. The host 102 and the memory system 104 can communicate content (e.g., write data and/or read data) over the data connection 116. The alert connection 114 can be used to communicate detection of various conditions between the host 102 and the memory system 104. For example, the host 102 and the memory system 104 can communicate the alert signal to report communication errors on the command-address connection 112 and/or the data connection 116.

The host 102 can include circuitry to handle various errors. In some embodiments, the host 102 can include an error handler 122 and/or a command queue 124. The error handler 122 can be configured to detect an error, track a timing associated with the error, and/or control an interface with the memory system 104 in responding to the error. For example, the error handler 122 can wait a predetermined period of time and retransmit one or more commands, addresses, write/read data associated with or following the error. The command queue 124 can track a predetermined number of operation commands (e.g., reads, writes, and/or refreshes) issued or to-be issued by the host 102. The host 102 can use the tracked commands for the error-based retransmissions.

The memory system 104 can include one or more devices for storing and providing access to information. The memory system 104 can include one or more devices, such as one or more storage devices 142 (e.g., storage devices $142_{1-n}$) and/or a register device 144. The storage devices 142 can include memory cells configured to retain an electrical charge and/or a magnetic state. The storage devices 142 can vary an amount of the electrical charge and/or the magnetic state to store the data. Further, the storage devices 142 can determine and report the amount of the electrical charge and/or the magnetic state in reading the data. The register device 144 can manage an interaction between the storage devices 142 and the host 102. For example, the register device 144 can manage timing, one or more clock signals, and/or register control. As an illustrative example, the memory system 104 can be a memory module (e.g., a single in-line memory module (SIMM) or a dual in-line memory module (DIMM)) and the storage devices 142 can be RAM chips. In some embodiments, the register device 144 can include a register clock driver (RCD) chip.

In some embodiments, the register device 144 can include a schedule management circuit 152 configured to manage the time-window for performing the memory-internal operations (e.g., refresh operations, such as RHRs). The schedule management circuit 152 can detect one or more predetermined conditions associated with the memory-internal operations, such as via a detection circuit 154 (e.g., a row-hammer detection circuit). In response to the detection, the schedule management circuit 152 can determine a scheduled duration (via, e.g., a scheduling circuit 156) for executing one or more memory-internal operations.

The scheduling circuit 156 can be configured to generate scheduling outputs that interact with the host 102 to secure time windows for the memory system 104 to execute the memory-internal operations. For example, the scheduling circuit 156 can generate the scheduling outputs that force error conditions, such as by reporting to or causing errors for the host 102 independent of an occurrence of an actual error condition. The scheduling circuit 156 can include one or more transistors configured to drive one or more outputs (via, e.g., the alert connection 114 and/or the data connection 116) to a predetermined stage/level based on the detection. Accordingly, the scheduling circuit 156 can generate and send an ALERT #signal and/or adjust communicated data for CA parity communication failures, CRC failures, high temperature reports, flipping DQs, command CA parity errors, data write and/or read CRC errors, and/or other alert messages.

FIG. 2 is a block diagram of a computing system 200 in accordance with an embodiment of the present technology. The computing system 200 can be similar to the computing system 100 of FIG. 1. For example, the computing system 200 can include a host 202 (e.g., a processor, a central processing unit (CPU), a graphics processing unit (GPU), and/or other computing device) and a memory system 204 (e.g., a non-volatile memory module, a volatile memory module, a combinational system, and/or other memory card/system). Also, the host 202 and the memory system 204 can be communicatively coupled via a command-address connection 212 (e.g., a command and address bus), an alert connection 214 (e.g., an Alert line for ALERT #signal for DDR4/5 protocol), and/or a data connection 216 (e.g., a data (DQ) bus). The host 202 can include circuitry to handle various errors, such as an error handler 222 and/or a command queue 224, similar to the host 102 of FIG. 1, the error handler 122 of FIG. 1 and/or the command queue 124 of FIG. 1.

The memory system 204 can include one or more storage devices 242 (e.g., storage devices $242_{1-n}$, such as RAM chips) that include memory cells configured to retain an electrical charge and/or a magnetic state. The storage devices 242 can vary an amount of the electrical charge and/or the magnetic state to store the data. Further, the storage devices 242 can determine and report the amount of the electrical charge and/or the magnetic state in reading the data. In some embodiments, the alert connection 214 can include a shared bus that couple the storage devices 242 to the host 202.

In one or more embodiments, each of the storage devices 242 can include a schedule management circuit 252 configured to manage the time-window for performing the memory-internal operations (e.g., refresh operations, such as RHRs). The schedule management circuit 252 can detect one or more predetermined conditions (e.g., row hammer or other repeated access conditions) associated with the memory-internal operations, such as via a detection circuit 254 (e.g., a row-hammer detection circuit). In response to the detection, the schedule management circuit 252 can determine a scheduled duration (via, e.g., a scheduling circuit 256) for executing one or more memory-internal operations.

The scheduling circuit 256 can be configured to generate scheduling outputs that interact with the host 202 to secure time windows for the memory system 204 to execute the memory-internal operations. For example, the scheduling circuit 256 can generate the scheduling outputs that force error conditions, such as by reporting to or causing errors for the host 202 independent of an occurrence of an actual error condition. The scheduling circuit 256 can include one or more transistors configured to drive one or more outputs (via, e.g., the alert connection 214 and/or the data connection 216) to a predetermined stage/level based on the detection. Accordingly, the scheduling circuit 256 can generate and send an ALERT #signal and/or adjust communicated data for CA parity communication failures, CRC failures, high temperature reports, flipping DQs, command CA parity errors, data write and/or read CRC errors, and/or other alert messages.

Figure 3:
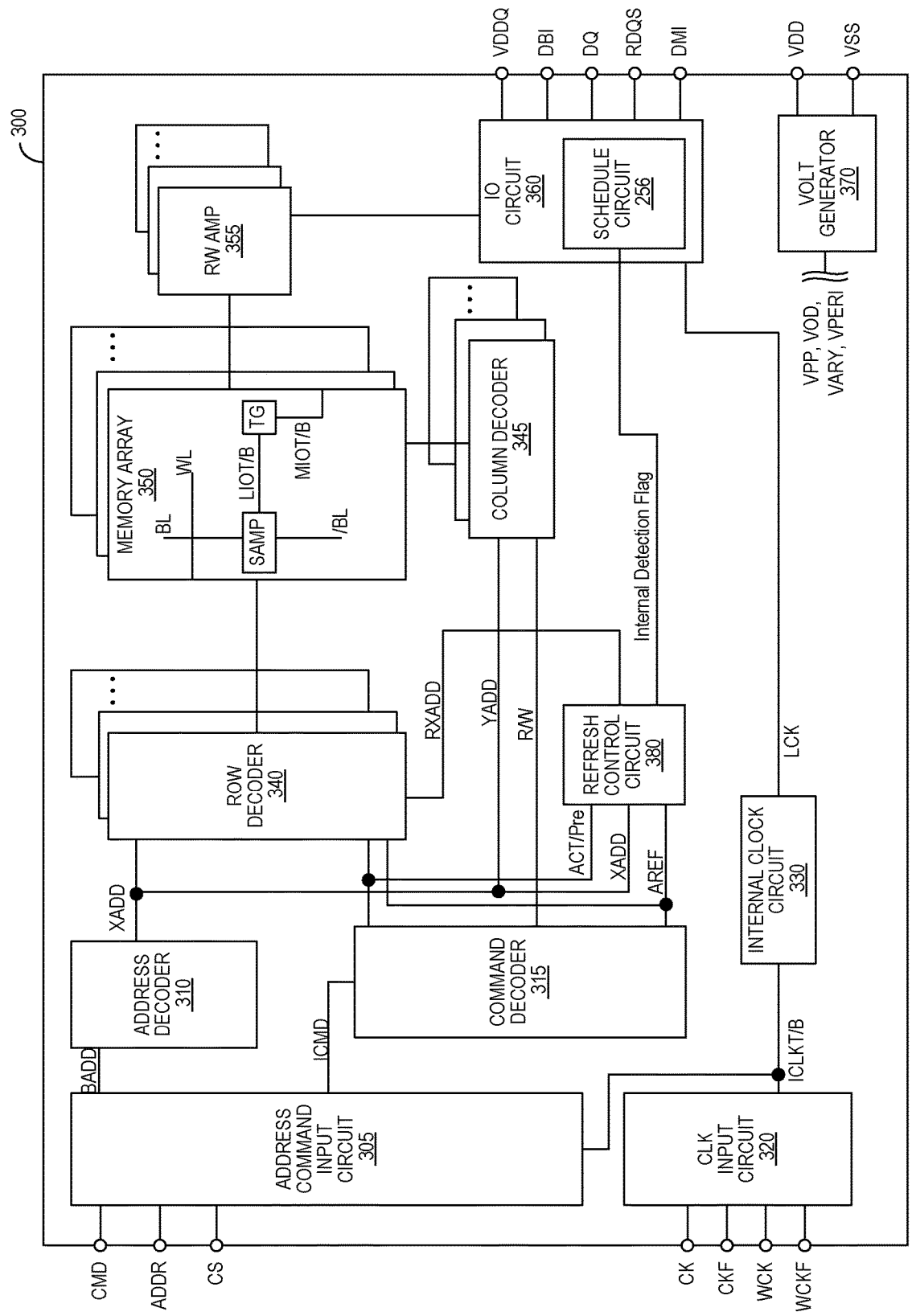
FIG. 3 is a block diagram of an apparatus in accordance with an embodiment of the present technology.

FIG. 3 is a block diagram of a device 300 (e.g., a semiconductor die assembly, including a 3DI device or a die-stacked package) in accordance with an embodiment of the present technology. For example, the device 300 can include a DRAM (e.g., DDR3 DRAM, DDR4 DRAM, DDR5 DRAM, etc.), or a portion thereof that includes one or more dies/chips. In some embodiments, the device 300 can include synchronous DRAM (SDRAM) of DDR type integrated on a single semiconductor chip. The device 300 can correspond to the storage devices 142 of FIG. 1 and/or the storage devices 242 of FIG. 2.

The device 300 may include an array of memory cells, such as memory array 350. The memory array 350 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 340, and the selection of a bit line BL may be performed by a column decoder 345. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 350 may also include plate lines and corresponding circuitry for managing their operation.

The device 300 may employ a plurality of external terminals that include command and address terminals coupled to a command bus and an address bus to receive command signals (CMD) and address signals (ADDR), respectively. The device 300 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 3) from outside. The address signal and the bank address signal supplied to the address terminals can be transferred, via a command/address input circuit 305, to an address decoder 310. The address decoder 310 can receive the address signals and supply a decoded row address signal (XADD) to the row decoder 340, and a decoded column address signal (YADD) to the column decoder 345. The address decoder 310 can also receive the bank address signal and supply the bank address signal to both the row decoder 340 and the column decoder 345.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the device 300 to respond to commands and addresses provided to the command and address terminals. When an active chip select signal is provided to the device 300, the commands and addresses can be decoded and memory operations can be performed. The command signals may be provided as internal command signals ICMD to a command decoder 315 via the command/address input circuit 305. The command decoder 315 may include circuits to decode the internal command signals ICMD to generate various internal signals and commands for performing memory operations, for example, a row command signal to select a word line and a column command signal to select a bit line. The command decoder 315 may further include one or more registers for tracking various counts or values (e.g., counts of refresh commands received by the device 300 or self-refresh operations performed by the device 300).

Read data can be read from memory cells in the memory array 350 designated by row address (e.g., address provided with an active command) and column address (e.g., address provided with the read). The read command may be received by the command decoder 315, which can provide internal commands to input/output circuit 360 so that read data can be output from the data terminals DQ, RDQS, DBI, and DMI via read/write amplifiers 355 and the input/output circuit 360 according to the RDQS clock signals. The read data may be provided at a time defined by read latency information RL that can be programmed in the device 300, for example, in a mode register (not shown in FIG. 3). The read latency information RL can be defined in terms of clock cycles of the CK clock signal. For example, the read latency information RL can be a number of clock cycles of the CK signal after the read command is received by the device 300 when the associated read data is provided.

Write data can be supplied to the data terminals DQ, DBI, and DMI according to the WCK and WCKF clock signals. The write command may be received by the command decoder 315, which can provide internal commands to the input/output circuit 360 so that the write data can be received by data receivers in the input/output circuit 360, and supplied via the input/output circuit 360 and the read/write amplifiers 355 to the memory array 350. The write data may be written in the memory cell designated by the row address and the column address. The write data may be provided to the data terminals at a time that is defined by write latency WL information. The write latency WL information can be programmed in the device 300, for example, in the mode register (not shown in FIG. 3). The write latency WL information can be defined in terms of clock cycles of the CK clock signal. For example, the write latency WL information can be a number of clock cycles of the CK signal after the write command is received by the device 300 when the associated write data is received.

The power supply terminals may be supplied with power supply potentials VDD and VSS. These power supply potentials VDD and VSS can be supplied to an internal voltage generator circuit 370. The internal voltage generator circuit 370 can generate various internal potentials VPP, VOD, VARY, VPERI, and the like based on the power supply potentials VDD and VSS. The internal potential VPP can be used in the row decoder 340, the internal potentials VOD and VARY can be used in the sense amplifiers included in the memory array 350, and the internal potential VPERI can be used in many other circuit blocks.

The power supply terminal may also be supplied with power supply potential VDDQ. The power supply potential VDDQ can be supplied to the input/output circuit 360 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 360 so that power supply noise generated by the input/output circuit 360 does not propagate to the other circuit blocks.

The clock terminals and data clock terminals may be supplied with external clock signals and complementary external clock signals. The external clock signals CK, CKF, WCK, WCKF can be supplied to a clock input circuit 320. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 320 can receive the external clock signals. For example, when enabled by a clock/enable signal from the command decoder 315, an input buffer can receive the clock/enable signals. The clock input circuit 320 can receive the external clock signals to generate internal clock signals ICLK. The internal clock signals ICLK can be supplied to an internal clock circuit 330. The internal clock circuit 330 can provide various phase and frequency controlled internal clock signals based on the received internal clock signals ICLK and a clock enable (not shown in FIG. 3) from the command/address input circuit 305. For example, the internal clock circuit 330 can include a clock path (not shown in FIG. 3) that receives the internal clock signal ICLK and provides various clock signals to the command decoder 315. The internal clock circuit 330 can further provide input/output (IO) clock signals. The IO clock signals can be supplied to the input/output circuit 360 and can be used as a timing signal for determining an output timing of read data and the input timing of write data. The IO clock signals can be provided at multiple clock frequencies so that data can be output from and input to the device 300 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The device 300 can be connected to any one of a number of electronic devices capable of utilizing memory for the temporary or persistent storage of information, or a component thereof. For example, a host device of device 300 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to device 300, although in other embodiments, the host device may be indirectly connected to memory device (e.g., over a networked connection or through intermediary devices).

The device 300 can include a refresh control circuit 380 configured to control refreshing of the information of the corresponding memory cell MC. For example, as inputs, the refresh control circuit 380 can receive the decoded row address signal (XADD) from the address decoder 310, a refresh signal (AREF) from the command decoder 315, an active signal (ACT) and/or a precharge signal (Pre) from the command decoder 315, etc. The command decoder 315 can generate the active signal (ACT) (e.g., a pulse signal) when the command signals (CMD) indicates row access (e.g., active command). The command decoder 315 can generate the precharge signal (Pre) (e.g., a pulse signal) when the command signal (CMD) indicates pre-charge. The command decoder 315 can generate the refresh signal (AREF) (e.g., a pulse signal) when the command signal (CMD) indicates an auto-refresh command and/or a self-refresh entry command. In response to the self-refresh entry command, the refresh signal (AREF) can be activated cyclically at a desired interval until a self-refresh exit command is received. In some embodiments, in response to the refresh signal (AREF), the refresh control circuit 380 can generate a refresh row address (RXADD) to the row decoder 340, which initiates the refresh operation therein (e.g., by activating a predetermined word line in the memory cell array). Accordingly, the device 300 can implement a refresh operation (e.g., scheduled refreshes) to refresh (e.g., increase stored charges) targeted locations.

In some embodiments, the refresh control circuit 380 can include the detection circuit 254 of FIG. 2 configured to control the RHR operation. The detection circuit 254 can be configured to detect row hammer and control and/or schedule the RHR operation and refresh word lines that are adjacent to hammered (e.g., accessed more than a threshold amount of times over a predetermined period since the last refresh operation) word lines. For implementing the RHR, the refresh control circuit 380 can generate one or more RHR addresses that identify the victim row(s) (e.g., the row(s) adjacent to or within a distance from the hammered row).

The refresh control circuit 380 (e.g., the detection circuit 254) can include counters that track row access and logic configured to compare the access count to a predetermined limit. When the access count reaches the limit, the refresh control circuit 380 (e.g., the detection circuit 254 and/or other circuits within the refresh control circuit 380) can identify the corresponding row as the hammered row and adjacent row as the victim row. Based on identifying the victim row, the refresh control circuit 380 can generate the address of the victim row as the RHR address.

The refresh control circuit 380 can provide a refresh address (e.g., the RHR address) to a decoder (e.g., the row decoder 340) for executing the memory-internal operation. The refresh control circuit 380 can also provide detection flags to the input/output circuit 360 based on detecting the predetermined conditions. The input/output circuit 360 can include the scheduling circuit 256 that generate the scheduling outputs based on the detection flags. For example, the scheduling circuit 256 can set the ALERT #and/or set one or more bits for the DATA signal, such as for a check error, a communication error, data/command error, etc. described above.

Figure 4:
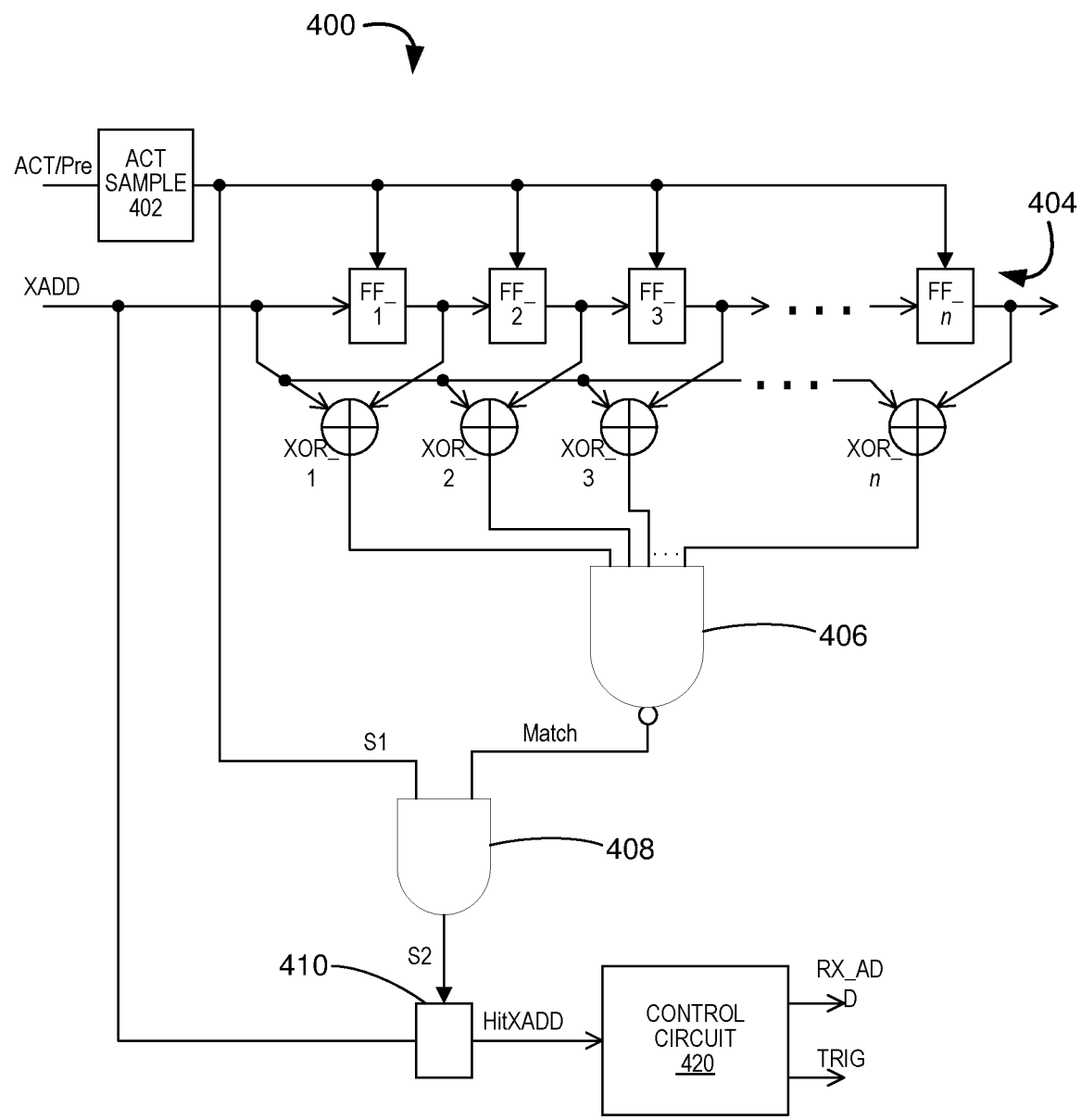
FIG. 4 is an example circuit diagram of a detection circuit in accordance with an embodiment of the present technology.

FIG. 4 is an example circuit diagram of a detection circuit 400 (e.g., an embodiment of the refresh control circuit 380 of FIG. 3, the detection circuit 154 of FIG. 1, and/or the detection circuit 254 of FIG. 2) in accordance with an embodiment of the present technology. The detection circuit 400 can receive a refresh signal (AREF), an active signal (ACT), a pre-charge signal (Pre), a row address XADD, etc. from other circuits, such as the address decoder 310 of FIG. 3 and/or the command decoder 315 of FIG. 3.

In some embodiments, the detection circuit 400 can include a sampling signal generator 402 and/or a shift register 404. The sampling signal generator 402 can be configured to generate a first sampling signal (S1). The shift register 404 can be configured to implement shift operations synchronized with the first sampling signal (S1).

The sampling signal generator 402 can randomly extract the active signal (ACT) or the pre-charge signal (Pre), which is generated in response to an active command or a pre-charge command. The sampling signal generator 402 can output the signal as the first sampling signal (S1). The random extraction can be configured to control the sampling rate that optimizes the reliability of the RHR operations. The sampling signal generator 402 can control the sampling rate based on the appearance frequency of hammer addresses, the number of stages of the shift register 404, etc.

In some embodiments, the shift register 404 can include n-stages of flip-flop circuits (FF_1 to FF_n) in cascade connection for latching the row addresses (XADD). In other words, an output node of the flip-flop circuit of a former stage can be connected to an input node of the flip-flop circuit of a subsequent stage. The first sampling signal (S1) can be commonly input to clock nodes of the flip-flop circuits. As a result, when the first sampling signal (S1) is activated, the current row address (XADD) can be latched by the flip-flop circuit FF_1 of a first stage, and the row addresses (XADD) latched by the flip-flop circuits FF_1 to FF_n−1 can be respectively shifted to the flip-flop circuits FF_2 to FF_n of next stages. The row address (XADD) latched by the flip-flop circuit FF_n, which is a last stage, can be discarded in response to activation of the first sampling signal (S1).

The row addresses (XADD) latched by the flip-flop circuits FF_1 to FF_n can be supplied to first-side input nodes of corresponding comparator circuits XOR_1 to XOR_n, respectively. The current row address (XADD) can be supplied to second-side input nodes of the comparator circuits XOR_1 to XOR_n. As a result, if the current row address (XADD) matches any of the row addresses (XADD) latched by the flip-flop circuits FF_1 to FF_n, the output of the comparator circuit XOR_1 to XOR_n thereof can be activated to a low level. Accordingly, a match signal (Match) output from a NAND 406 can be activated to a high level.

The match signal (Match) and the first sampling signal (S1) can be supplied to an AND 408. When both of the match signal (Match) and the first sampling signal (S1) are activated to the high level, a second sampling signal (S2) output from the AND 408 can be activated to the high level. More specifically, if the row address (XADD) supplied when the first sampling signal (S1) is activated within past n-times matches the row address (XADD) supplied when the first sampling signal (S1) is currently activated, the second sampling signal S2 can be activated. In other words, the access to the word lines (WL) can be intermittently monitored, and, if the access to the same word line WL is captured at least a predetermined number of times (e.g., two or more times) within a predetermined period of time, the second sampling signal (S2) can be activated.

The second sampling signal S2 can be supplied to a latch circuit 410. The latch circuit 410 can be configured to latch the current row address (XADD) in response to the second sampling signal (S2). The latch circuit 410 can output the latched result to a control circuit 420 as a row address (HitXADD) that corresponds to the word line WL having a high access frequency. The control circuit 420 can be configured to convert the row address (HitXADD) output from the latch circuit 410 to a row address RXADD of the word line WL affected by the highly-frequent access. In other words, the row address (HitXADD) can be an aggressor address, and the row address (RXADD) can be a victim address, such as for the word line (WL) adjacent to or within a predetermined distance from the word line (WL) accessed by the aggressor address. The control circuit 420 can also be configured to generate a trigger (e.g., the internal detection flag) based on detecting the repeated-access condition.

For illustrative purposes, the detection circuit 400 is shown as detecting repeated row-accesses (e.g., row hammer conditions). However, it is understood that the detection circuit 400 can be configured to detect other repetitive access conditions, such as for columns, other locations, and/or other patterns.

Figure 5:
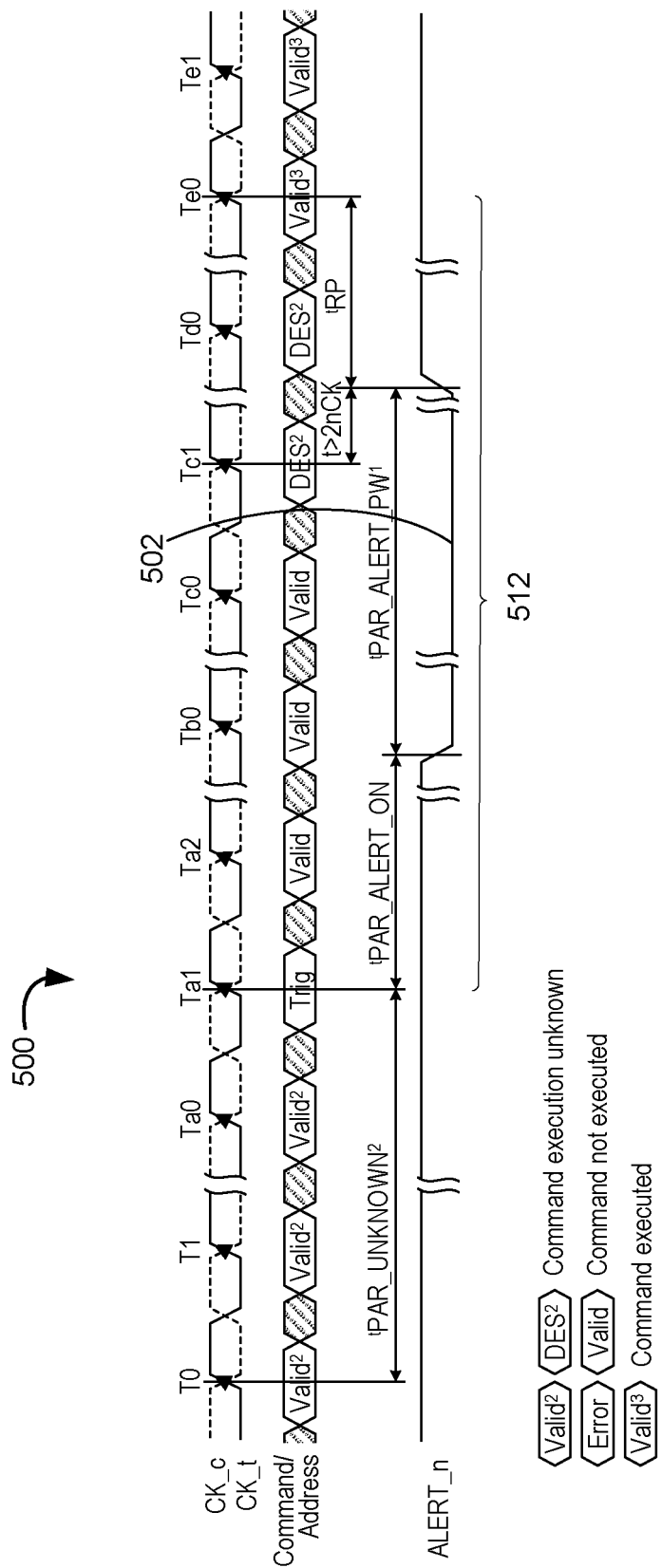
FIG. 5 is an example timing diagram in accordance with an embodiment of the present technology.

FIG. 5 is an example timing diagram 500 in accordance with an embodiment of the present technology. The timing diagram 500 illustrates an example reactionary process implemented by the host (e.g., the host 102 of FIG. 1 and/or the host 202 of FIG. 2) in response to a scheduling output 502 from the memory (e.g., the memory system 104 of FIG. 1, the memory system 204 of FIG. 2, and/or one or more devices therein). As an illustrative example, the scheduling output 502 can correspond to an ALERT signal associated with parity errors. The timing diagram 500 can illustrate an error-handling or recovery process implemented by the host in response to the ALERT signal.

In some embodiments, the memory device can be configured to ignore or not execute a predetermined number of commands/operations following detection of an error or a predetermined condition (e.g., repeated-access). For example, the memory device can detect at time Ta1 a triggering condition, such as a parity error or a row hammer, and subsequently ignore the received valid commands (e.g., at Ta2, Tb0, etc.). The memory device can be configured to generate the scheduling output 502 by setting the ALERT signal low within a predetermined period following the detection, thereby notifying the host of the detected condition. Accordingly, the host can be configured to resend the ignored commands (e.g., a predetermined number of commands preceding and/or following the scheduling output 502).

Based on the error recover process of the host, the memory device can determine an internal-operation window 512 for executing the memory-internal operations (e.g., refreshes). In other words, since the host is configured to resend a known amount of commands, the memory device can secure a corresponding time window to execute the memory-internal operations. The memory device can determine the internal-operation window 512 based on the determination and/or the scheduling output 502. In some embodiments, the memory device can determine internal-operation window 512 to start from the determination, the generation of the scheduling output 502, or a predetermined number of cycles subsequent thereto. In some embodiments, the memory device can determine the internal-operation window 512 to extend into or through the scheduling output 502 (e.g., tPAR_ALERT_PW) and/or a following window (e.g., recovery window, tRP). In some embodiments, the internal-operation window 512 extends up to a predetermined time for the recovery process (e.g., Te0), such as when execution of commands are required.

Figure 6:
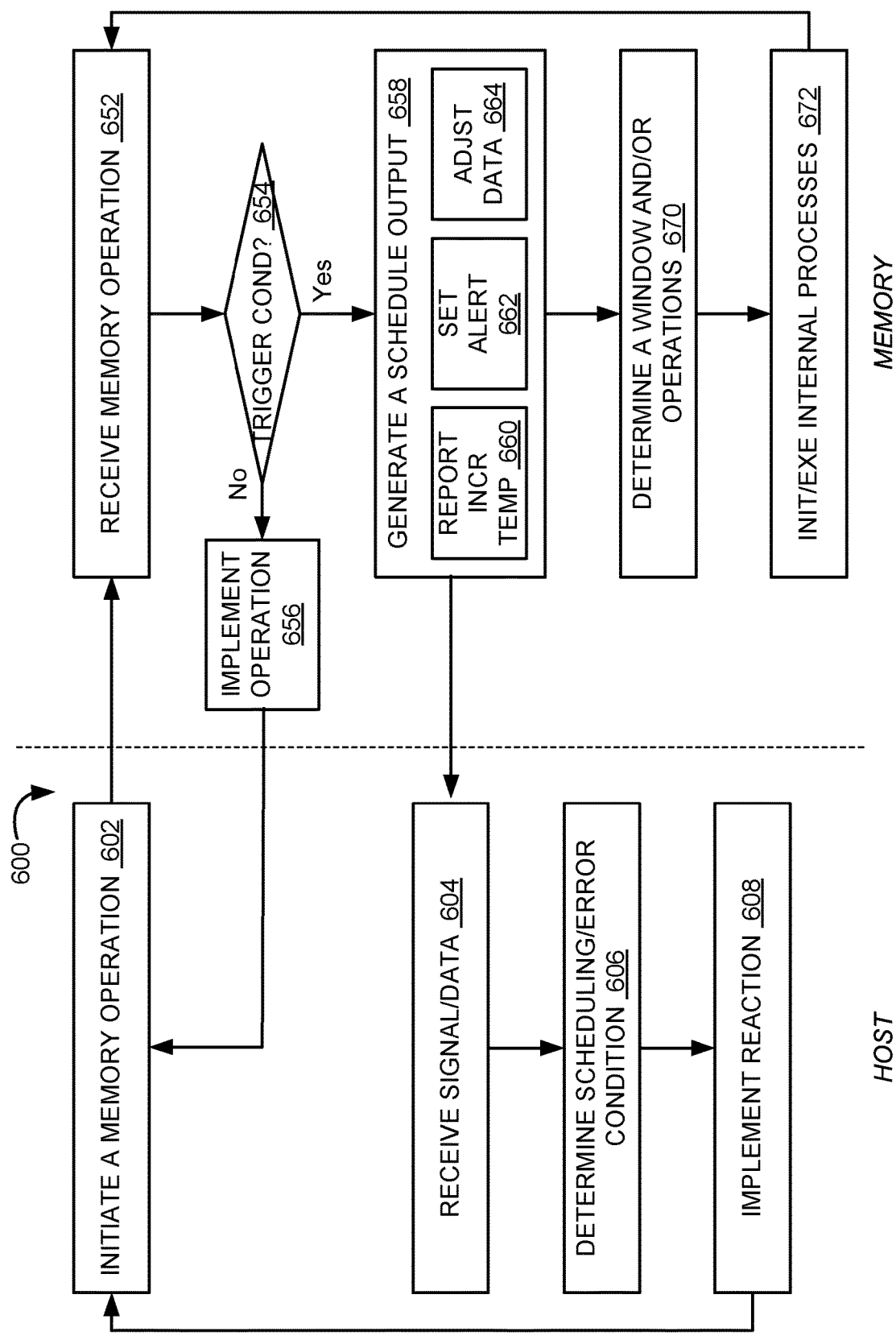
FIG. 6 is a flow diagram illustrating an example method of operating an apparatus in accordance with an embodiment of the present technology.

FIG. 6 is a flow diagram illustrating an example method 600 of operating an apparatus (e.g., the system 100 of FIG. 1, the system 200 of FIG. 2, and/or one or more devices therein) in accordance with an embodiment of the present technology. The method 600 can be for operating the host 102 of FIG. 1, the host 202 of FIG. 2, the memory device 104 of FIG. 1, the register device 144 of FIG. 1, the storage device 242 of FIG. 2, and/or the device 300 of FIG. 3 to manage the memory-internal operations, such as refresh operations.

At block 602, the apparatus (e.g., the host) can initiate a memory operation, such as a write, a read, or a refresh. The host can communicate one or more commands, addresses, and/or data associated with the memory operation to the memory device (via, e.g., one or more connections illustrated in FIG. 1 and/or FIG. 2). At block 652, the apparatus (e.g., the memory device) can receive the information associated with the memory operation.

At block 654, the apparatus (e.g., the memory device) can determine whether the received memory operation satisfies a predetermined condition. For example, the memory device can use the detection circuit 154 of FIG. 1 and/or the detection circuit 254 of FIG. 2 to track a number of accesses to one or more addresses/regions within a given duration. The memory device can detect the triggering condition, such as a repeated access (e.g., row hammer condition), when the tracked number matches or exceeds a predetermined threshold. When the received memory operation does not satisfy the predetermined condition, such as illustrated at block 656, the apparatus (e.g., the memory device) can implement the commanded memory operation. Accordingly, the apparatus can continue operation and initiate/execute a subsequent memory operation.

When the received memory operation satisfies the predetermined condition, such as illustrated at block 658, the apparatus (e.g., the memory device) can generate a schedule output. For example, the memory device can generate the schedule output as a mechanism (via, e.g., a signal and/or data sent to the host) to secure a time window (e.g., the internal-operation window 512 of FIG. 5) during which the host pauses commands/initiations of scheduled operations. Accordingly, the memory device can execute memory-internal operations during the secured time window.

In some embodiments, as illustrated at block 660, the apparatus can generate the schedule output by reporting increased temperature levels. For example, the memory device can report to the host (e.g., per regular reporting timing) a temperature level that is higher than the actual current temperature. Accordingly, the host can increase the refresh rate according to the reported temperature level, thereby increasing the frequency of the refresh operations and the corresponding time windows. In some embodiments, the memory device can determine a measure (e.g., a duration, a rating, an amount, an access frequency, etc.) associated with the internal operations. The memory device can increase the reported temperature level according to the determined measure.

In some embodiments, as illustrated at block 662, the apparatus can generate the schedule output by setting an alert (e.g., a signal or a flag) independent of the represented condition. For example, the memory device can set the ALERT #for DDR4/5 connections. Based on the alert, the memory device can report to the host one or more errors independent of the actual occurrence of such errors. For example, even without the occurrence of corresponding error conditions, the memory device can set the alert signal and predetermined bits to represent data write/read CRC errors, command CA parity errors, and/or other errors.

In some embodiments, as illustrated at block 662, the apparatus can generate the schedule output by adjusting data sent to the host. For example, the memory device can adjust one or more bits of read data that is sent to the host.

At block 604, the apparatus (e.g., the host) can receive the signal and/or the data associated with the schedule output. At block 606, the apparatus can determine the condition (e.g., the scheduling condition and/or the error condition) associated with the received signal/data. At block 608, the apparatus can implement the reaction. As an illustrative example, the host can increase the refresh rate (by, e.g., a factor of 2, 4, etc.) in response to determination of increased temperature of the memory device. Also, the host can retry write/read, resend commands, and/or implement recovery processes in response to determination of communication errors. Further, the host can retry reads in response to determining errors in the read data. In implementing the reactions, the host can pause implementation of subsequently scheduled operations for a time window that corresponds to the determined condition.

At block 670, the apparatus (e.g., the memory device) can determine the duration of the time window based on the determined condition and/or the schedule output. For example, the memory device can determine the windows (e.g., margins) associated with the increased refreshes that result from the increased temperature report. Also, the memory device can determine the internal-operation window 512 associated with retrying write/read, resending commands, and/or implementing recovery processes. The internal-operation window 512 for various different schedule outputs can be predetermined according to standards and/or host specifications. Accordingly, the memory device can use a lookup table or other stored information to determine the internal-operation window 512.

At block 672, the apparatus (e.g., the memory device) can use the internal-operation window 512 to initiate and/or execute memory-internal processes. For example, the memory device can execute refresh operations (e.g., RHR) during the secured operation window 512. Accordingly, the apparatus can dynamically adjust the scheduling of memory-internal operations based on real-time conditions without being limited to margins within/between host scheduled operations. In other words, the memory device can use the schedule output to interact with the host and secure the internal-operation window 512 for executing the memory-internal operations. Thus, the apparatus can reduce errors associated with insufficient durations to implement memory-internal operations and/or infrequent implementations thereof.

Figure 7:
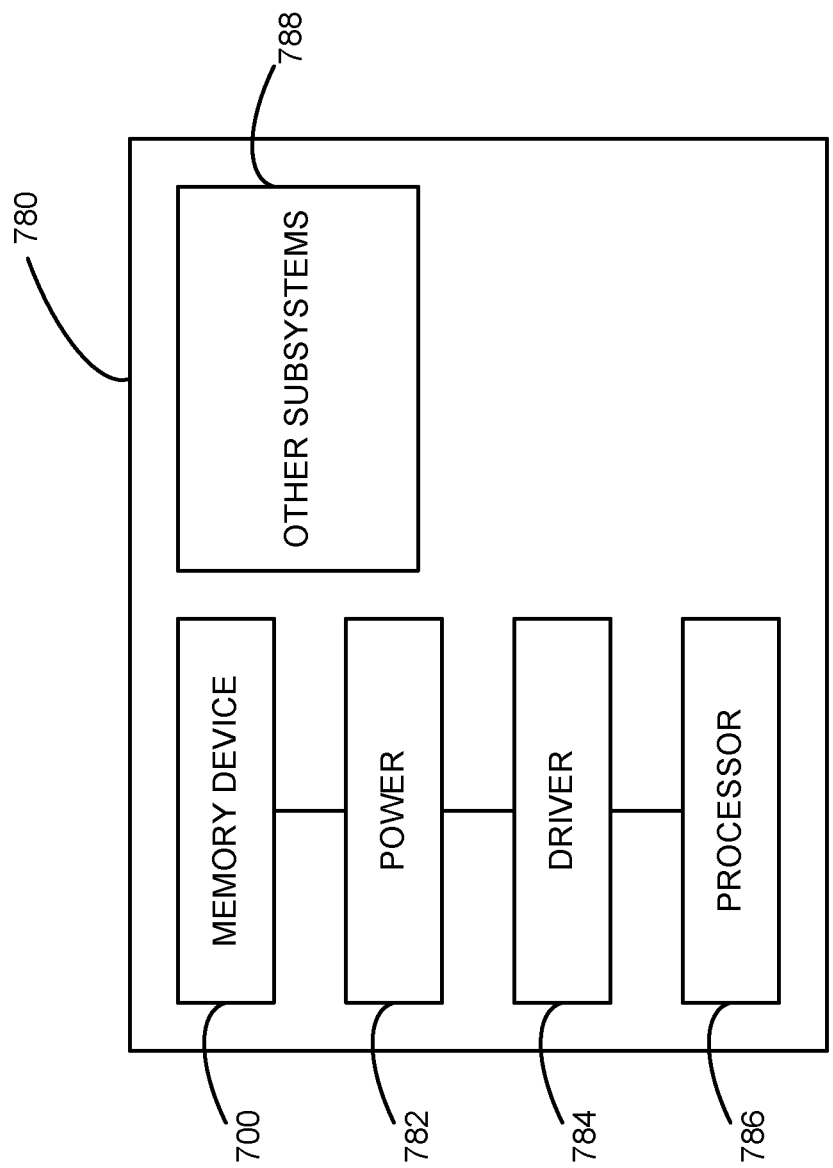
FIG. 7 is a schematic view of a system that includes an apparatus in accordance with an embodiment of the present technology.

FIG. 7 is a schematic view of a system that includes an apparatus in accordance with embodiments of the present technology. Any one of the foregoing apparatuses (e.g., memory devices) described above with reference to FIGS. 1-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the apparatus described above with reference to FIGS. 1-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

We claim:

1. An apparatus, comprising:
   a detection circuit configured to detect a condition associated with two or more accesses to a memory address or a memory region within a predetermined duration; and
   a scheduling circuit coupled to the detection circuit, the scheduling circuit configured to:
      generate a scheduling output based on the detected condition, wherein the scheduling output is communicated to a host coupled to the apparatus for securing a scheduled duration of inactivity for the apparatus, and
      trigger execution of one or more memory-internal operations during the scheduled duration.

2. The apparatus of claim 1, wherein the one or more memory-internal operations include one or more row hammer refresh operations.

3. The apparatus of claim 1, wherein the scheduling output represents a command address parity error, wherein the scheduling output is independent of an actual command address parity.

4. The apparatus of claim 1, wherein the scheduling output represents a cyclic redundancy check (CRC) error, wherein the scheduling output is independent of an actual CRC data.

5. The apparatus of claim 1, wherein the scheduling output is a predetermined state or value for an alert signal that reports an error condition in response to the detected condition, wherein the scheduling output is independent of the condition.

6. The apparatus of claim 5, wherein the scheduling output corresponds to an ALERT #signal according to a Double Data Rate (DDR) protocol.

7. The apparatus of claim 1, wherein the scheduling output includes one or more flipped data (DQ) bits.

8. The apparatus of claim 7, wherein the scheduling output is for triggering an error correction process at the host.

9. The apparatus of claim 1, wherein the scheduling output is configured to report a temperature level higher than an actual temperature reading for the apparatus.

10. The apparatus of claim 1, further comprising a register device.

11. The apparatus of claim 10, wherein the apparatus comprises a register clock driver.

12. The apparatus of claim 1, wherein the apparatus further comprises a memory array having a plurality of memory cells.

13. The apparatus of claim 1, wherein the apparatus comprises a dynamic random-access memory (DRAM).

14. The apparatus of claim 1, wherein the scheduling circuit includes a transistor connected to a corresponding connection port and the scheduling output, wherein the transistor is configured to force an output level at the connection port to a predetermined level when the scheduling output represents the detected condition.

15. A method of operating an apparatus, the method comprising:
   receiving a command for an operation from a host coupled to the apparatus;
   detecting a condition based on the command, wherein the condition is associated with two or more accesses to a memory address or a memory region within a predetermined duration;
   generating a scheduling output based on the detected condition, wherein the scheduling output is communicated to the host for securing a scheduled duration of inactivity for the apparatus; and
   initiating one or more internal operations during the scheduled duration.

16. The method of claim 15, further comprising executing the one or more internal operations during the scheduled duration, wherein the one or more internal operations include one or more row hammer refresh operations.

17. The method of claim 15, wherein generating the scheduling output includes communicating to the host a signal representative of an error condition in response to the detected condition, wherein the scheduling output is independent of the error condition.

18. The method of claim 15, wherein generating the scheduling output includes flipping one or more data (DQ) bits communicated with the host.

19. The method of claim 15, wherein generating the scheduling output includes reporting a temperature level higher than an actual temperature reading for the apparatus.

20. A system, comprising:
a host configured to command a memory operation; and
a memory device coupled to the host, the memory device configured to:
  detect a condition based on the memory operation, wherein the condition is associated with two or more accesses to a memory address or a memory region within a predetermined duration;
  generate a scheduling output based on the detected condition, wherein the scheduling output is communicated to the host for securing a scheduled duration of inactivity for the memory device; and
  initiate one or more memory-internal operations during the scheduled duration;
wherein:
the host is configured to pause scheduled operations for the scheduled duration including and/or subsequent to the memory operation.

21. The system of claim 20, wherein:
the scheduling output represents an error condition;
the memory device is configured to:
  generate the scheduling output based on the detected condition and independent of the error condition, and
  execute the one or more memory-internal operations during the scheduled duration; and
the host is configured to implement an error recovery process during the scheduled duration based on the scheduling output from the memory device.

* * * * *